United States Patent [19]
Nagata

[11] Patent Number: 5,841,708
[45] Date of Patent: Nov. 24, 1998

[54] SEMICONDUCTOR MEMORY DEVICE HAVING SMALL CHIP SIZE AND REDUNDANCY ACCESS TIME

[75] Inventor: Kyoichi Nagata, Tokyo, Japan

[73] Assignee: NEC Corporation, Tokyo, Japan

[21] Appl. No.: 731,742

[22] Filed: Oct. 18, 1996

[30] Foreign Application Priority Data

Oct. 18, 1995 [JP] Japan .................................. 7-268914

[51] Int. Cl.⁶ .................................................. G11C 7/00
[52] U.S. Cl. ................. 365/200; 365/185.09; 365/185.23
[58] Field of Search ............................. 365/200, 185.09, 365/185.23; 371/10.2, 10.3

[56] References Cited

U.S. PATENT DOCUMENTS

| | | | |
|---|---|---|---|
| 4,660,179 | 4/1987 | Aoyama | 365/200 |
| 4,817,056 | 3/1989 | Furutani et al. | 365/200 |
| 5,255,234 | 10/1993 | Seok | 365/200 X |
| 5,295,114 | 3/1994 | Kobayashi | 365/200 X |

*Primary Examiner*—David C. Nelms
*Assistant Examiner*—Hoai Ho
*Attorney, Agent, or Firm*—Foley & Lardner

[57] ABSTRACT

A semiconductor memory circuit designed so as to prevent delay in redundancy access and increase in the chip area due to lengthy wiring between the redundancy control circuit (the redundancy fuse circuits) and the redundancy cell arrays. Redundancy cell arrays 30–32 are placed in a plurality of memory cell arrays 20–23, and the corresponding redundancy fuse circuits 80–82 disposed to make a line with the redundancy word drivers 51–53, respectively. For example, when a defective address is selected 4n redundancy fuse circuit 80, a redundancy judgment signal RDN suspends all the sense amplifier controllers 40, 43 and 44. A redundancy control information RED1 instructs to select a redundancy word driver 51 and the sense amplifier controllers 41 and 42, to select the redundancy cell array 30.

5 Claims, 11 Drawing Sheets

SEMICONDUCTOR MEMORY DEVICE HAVING SMALL CHIP SIZE AND REDUNDANCY ACCESS TIME

BACKGROUND OF THE INVENTION

1. Field of the Invention

The present invention relates to a semiconductor memory device, and more particularly to a semiconductor memory device equipped with a redundancy circuit which compensates for a defect in the memory cell arrays.

2. Description of the Related Art

Semiconductor memories have a greater risk as the degree of integration increases. Particularly, such defects often occur in the regions of storage elements, and a redundancy circuit is indispensable for removing the effect of such defects. Redundancy circuits will now be briefly explained. Finished semiconductor memories undergo a proving inspection to determine whether the memory cells have a defect. When the result of the inspection indicates the presence of a defect in the memory cells, an alternative memory cell is provided which operates instead of the defective region. The alternative memory cell is a redundancy circuit; that is, a redundancy circuit is a backup memory cell which takes the place of the defective portion of main memory cells (hereunder referred to as redundancy cell). In order to operate a redundancy circuit, the main memory cells are equipped with fuses, and a fuse associated with a defective address is burnt. This disables access to the main memory when access to a defective address is requested, and overcomes the defect by accessing the associated redundancy cell instead.

Figure 8:
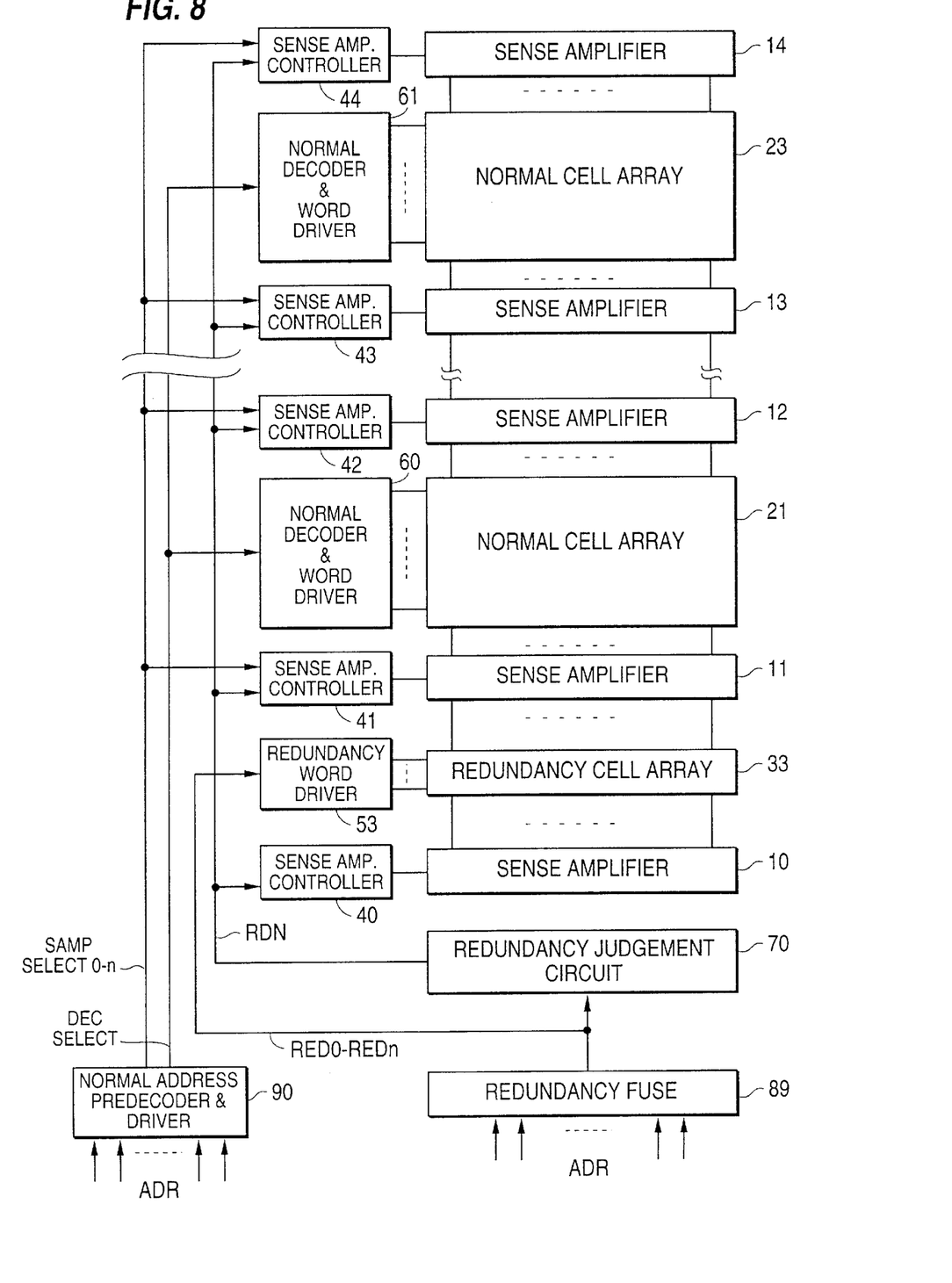
FIG. 8 is a block diagram illustrative of a semiconductor storage IC with a redundancy circuit according to the prior art.

FIG. 8 is an illustration of circuitry of a conventional memory equipped with a redundancy circuit. The illustrated circuitry comprises a plurality of normal cell arrays 21 and 23, and sense amplifiers 11–14 placed above and under the respective normal cell arrays 21 and 23. A redundancy cell array 33 is provided for the normal cell arrays 21 and 23, and sense amplifiers 10 and 11 are used as the sense amplifiers for the redundancy cell array 33. In addition, sense amplifier controllers 40–44 are provided for the respective sense amplifiers, while normal decoder & word drivers 60 and 61 are provided for the normal cell arrays 21 and 23, and a redundancy word driver 53 is provided for the redundancy cell array 33.

The operation will now be explained. When an access address ADR is input, a normal address predecoder & driver 90 produces sense amplifier-selecting signals SAMSELECT 0–m, and concurrently produces a decoder-selecting signal DECSELECT which determines the normal decoder & word driver to be selected. Here, in cases where the signal ADR indicates the address which corresponds to the normal cell array 23, sense amplifier controllers 43 and 44 are selected in response to the signal SAMPSELECT, while the normal decoder & word driver 61 is selected in response to the signal DECSELECT.

The signal ADR is concurrently input to a redundancy fuse circuit 89. The redundancy fuse circuit B9 detects whether the address is identical to the predesignated defective address, and outputs redundancy fuse output signals RED0–REDn. Here, although "n" number of redundancy fuse circuits 89 should be provided depending on the number of normal cell arrays, only one is illustrated in the drawing for simplicity.

When the signals RED0–REDn are input, a redundancy judgment circuit 70 produces a redundancy judgment signal RDN which indicates selection of a defective address to control the activation/inactivation of the respective sense amplifier controllers.

When the input access address ADR is not a defective address, the redundancy fuse circuit 89 outputs the signals RED0–REDn all at low levels. In response to the signals RED0–REDn, the redundancy judgment circuit 70 outputs the signal RDN at a low level. The signal RDN is input to all the sense amplifier controllers 40–44, in this case, turns off (inactivates) only the sense amplifier controllers 40 and 41 for the redundancy cell array 33.

In cases where the input access address ADR is a defective address, one of the signals RED0–REDn output from the redundancy fuse circuits 89 is turned to a high level, corresponding to the defective address, and one of the redundancy word drivers 53 is selected in response to the high level of the signal RED to select a redundancy word line. The signals RED0–REDn are concurrently input to the redundancy judgment circuit 70 to turn the signal RDN to a high level as well. The signal RDN is input to all the sense amplifier controllers 40–44 and turns off all the sense amplifier controllers 42–44 for the normal cell arrays. Also, the sense amplifier controllers 40 and 41 which corresponds to the redundancy cell array 33 are turned on by the signal RDN.

Figure 9:
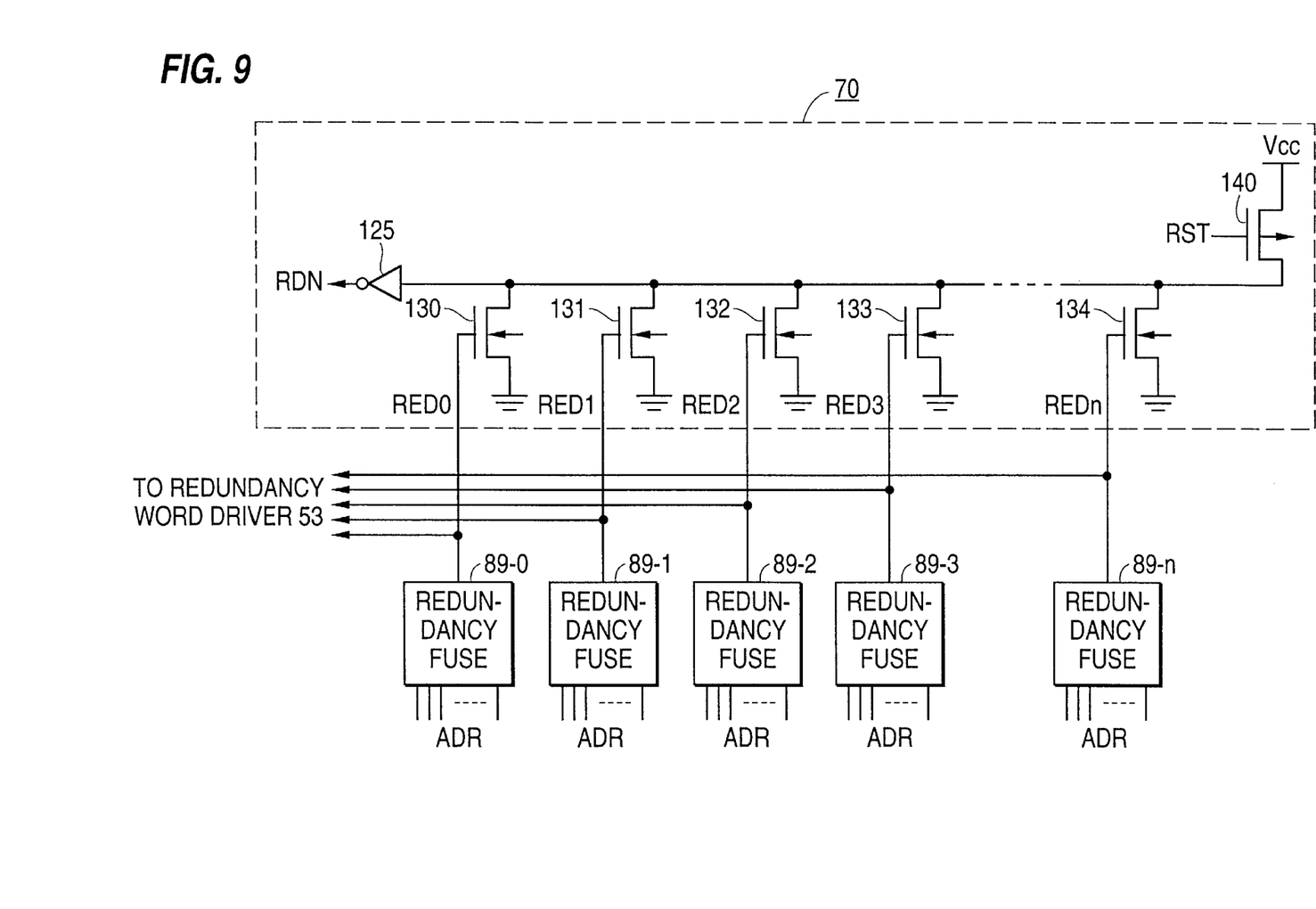
FIG. 9 is a circuit diagram of the redundancy judgment circuit shown in FIG. 8.

FIG. 9 is a circuit diagram illustrative of the redundancy fuse circuit 89 and the redundancy judgment circuit 70 in FIG. 8. The redundancy fuse circuits, only one of which is shown in FIG. 8 for simplicity, are provided in number "n" (89-0 through 89-n) corresponding to the "n" normal cell arrays. In addition, the output signals RED0–REDn from the redundancy fuse circuits 89 are input to the respective gates of transistors 130–134 in the redundancy judgment circuit 70, with the drains of the transistors wired-NOR-connected. The wired-NOR-connecting line is pulled up and connected to a power supply Vcc by a transistor 140, and its potential is derived as an output signal, or the redundancy judgment signal RDN via an inverter 125.

In the redundancy judgment circuit 70, a precharge signal RST which is input to the gate of the transistor 140 is active, and all the input signals RED0–REDn are at low levels at the initial state. Accordingly, the wired-NOR-connecting line is precharged to a high level. The precharge signal RST is then inactivated when the process proceeds to the activation stage, whereas the transistor 140 is turned off, with the wired-NOR-connecting line held in a high floating state. When a defective address is detected in this state, since one of the signals RED0–REDn becomes high, the wired-NOR-connecting line is rapidly brought to a low level. Therefore, the redundancy judgment signal RDN changes from a low level to a high level.

Figure 10:
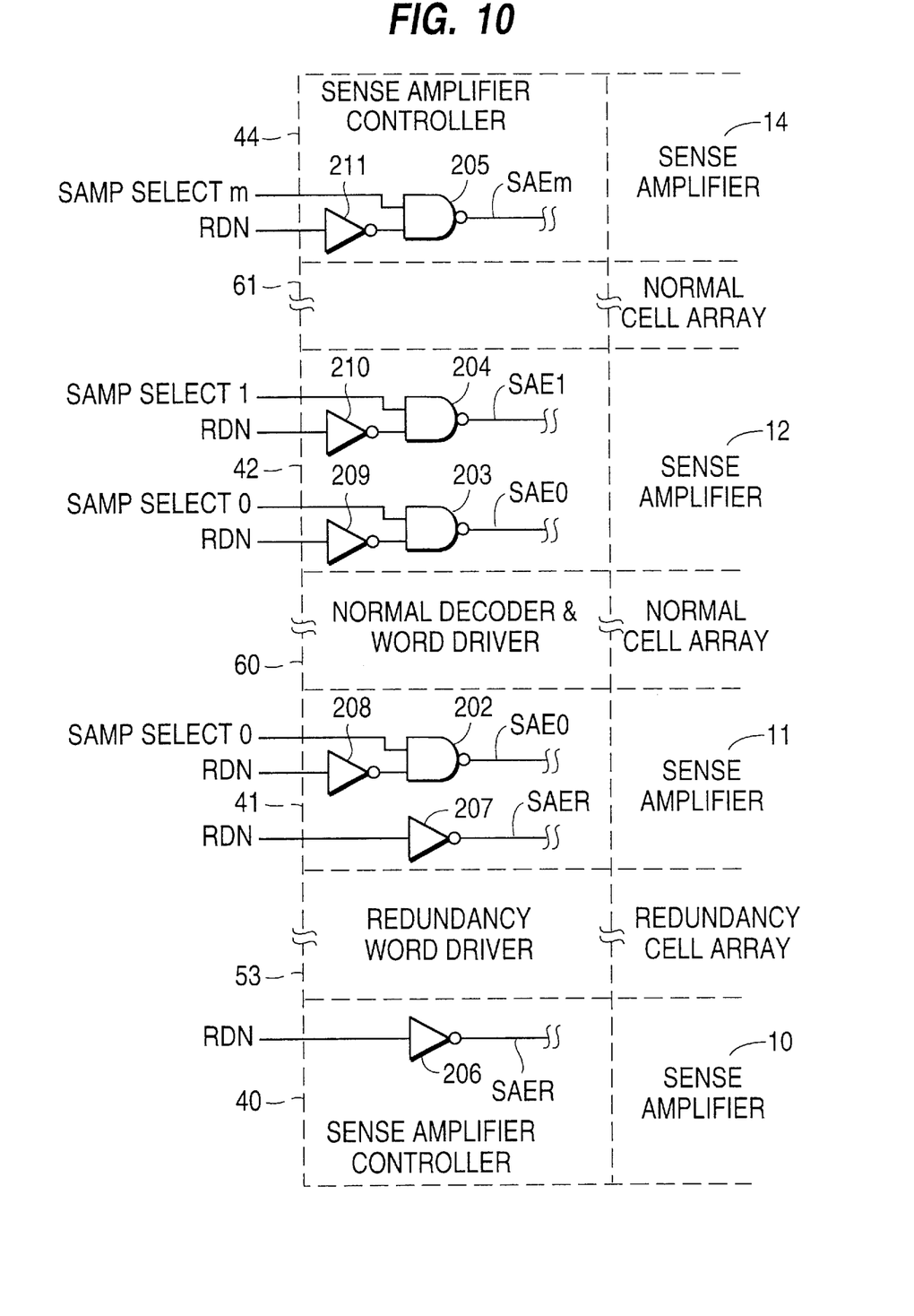
FIG. 10 is a circuit diagram of the sense amplifier controllers shown in FIG. 8.

FIG. 10 is an illustration of part of the sense amplifier controller circuit. Signals SAMPSELECT 0–m and signals RDN are input to sense amplifier controllers 40–44. According to the illustrated example, the sense amplifiers are inactivated when the outputs of the sense amplifier controllers are at high levels, and are activated when at low levels. Here, the sense amplifiers are selected when the signals SAMPSELECT are at high levels.

As mentioned above, the sense amplifiers 11–14 must be activated when the access address is not a defective address. Here, since the signals RDN become low, NAND gates 202–205 pass sense amplifier-selecting signals to activate the selected sense amplifiers. On the other hand, in cases where the access address is a defective address, since the signals RDN become high, and thus the NAND gates 202–205 produce high-level outputs at all times due to the presence of inverters 208–211, the signals SAMPSELECT 0–m become invalid to thereby inactivate the sense amplifiers. Since the signals RDN are concurrently input to inverters 206 and 207 as well, sense amplifier-activating signals SAER for the redundancy cell arrays are output at low levels to activate the sense amplifiers 10 and 11 which correspond to the redundancy cell array 33. Here, although the sense amplifiers 11–13 operate as the sense amplifiers for the corresponding cell arrays located above and under them, when a plurality of sense amplifier-activating signals SAE are input as the sense amplifier 12 illustrated in FIG. 10, the low-level signal SAE takes precedence, in other words, the sense amplifier is activated.

When a defective address is selected by the foregoing operation, since accessing is automatically switched to from the normal cell array corresponding to the defective address to the redundancy cell array, the defect of the memory cell can be compensated for.

With semiconductor memories of the prior art which are provided with redundancy circuits, since the redundancy fuse circuits and the redundancy word drivers are placed at distances, much time elapses until the redundancy word driver starts up after the decision has been made to switch to redundancy, and this prolonged time determines the address access time. This of course causes the drawback of delayed redundancy access as compared with the normal access when the word line for the redundancy cell array is selected. In addition, as is apparent from FIG. 9, the different wiring lengths from the respective redundancy fuse circuits to the redundancy word drivers may result in different delay times.

In addition, since the redundancy cell arrays are placed at locations for the fastest access, as if being packaged, to speed up the redundancy access, the redundancy word drivers are also combined at the same locations. As a result, the redundancy fuse circuits and the redundancy word drivers are placed at distances from each other, and this increases the chip area due to the increased wiring lengths. In addition, since sense amplifiers and sense amplifier controllers used solely for the redundancy cell arrays are needed, the chip area increases more.

Here, since the redundancy cell arrays are prepared to compensate for defects, it becomes impossible to perform replacement when the arrays fail. From a process viewpoint, however, the cell arrays and memory cells near the sense amplifiers have higher probabilities of failure, since defects may be caused at the ends of the cell arrays due to steps, etc.

SUMMARY OF THE INVENTION

It is an object of the present invention to provide a semiconductor memory with redundancy fuse circuits and redundancy word drivers placed with an optimized positional relationship established between them to speed up the redundancy access.

It is another object of the present invention to provide a semiconductor memory with a reduced chip area which is achieved by eliminating the sense amplifiers and the sense amplifier controllers used solely for the redundancy cell arrays.

It is yet another object of the present invention to provide a semiconductor memory which minimizes defects of the redundancy cell arrays.

It is yet another object of the present invention to provide a semiconductor memory with a reduced chip area through simplification of the address control which is achieved by designing the normal cell array-selecting circuits so as to serve also as the redundancy cell array-selecting circuits.

BRIEF DESCRIPTION OF THE DRAWINGS

FIGS. 7 (*a*) and (*b*) show block diagrams of the decoder & word drivers according to the first embodiment (the prior art) and the third embodiment of the present invention;

DETAILED DESCRIPTION

The operation according to the present invention will now be described. The present invention minimizes delays due to wiring between the blocks, and minimizes the wiring area by placing the redundancy fuse circuits, or the redundancy control circuit and the redundancy word drivers at locations to produce the shortest wiring lengths between them (preferably so as to achieve linear wiring between the circuits).

In addition, by placing the redundancy cell arrays in the normal cell arrays in a mixed manner in order to establish the above-mentioned positional relationship between the redundancy fuse circuits and the redundancy word drivers, the sense amplifiers may be designed so as to be used for both the normal cell arrays and the redundancy cell arrays. Therefore, there is no need to provide sense amplifiers used solely for the redundancy cell arrays, and this decreases the chip area.

DETAILED DESCRIPTION OF THE PREFERRED EMBODIMENTS

Embodiments of the present invention will now be described in detail with reference to the drawings. Here, like portions as used according to the prior art are designated by like reference numeral, and the explanations thereof are omitted.

Figure 1:
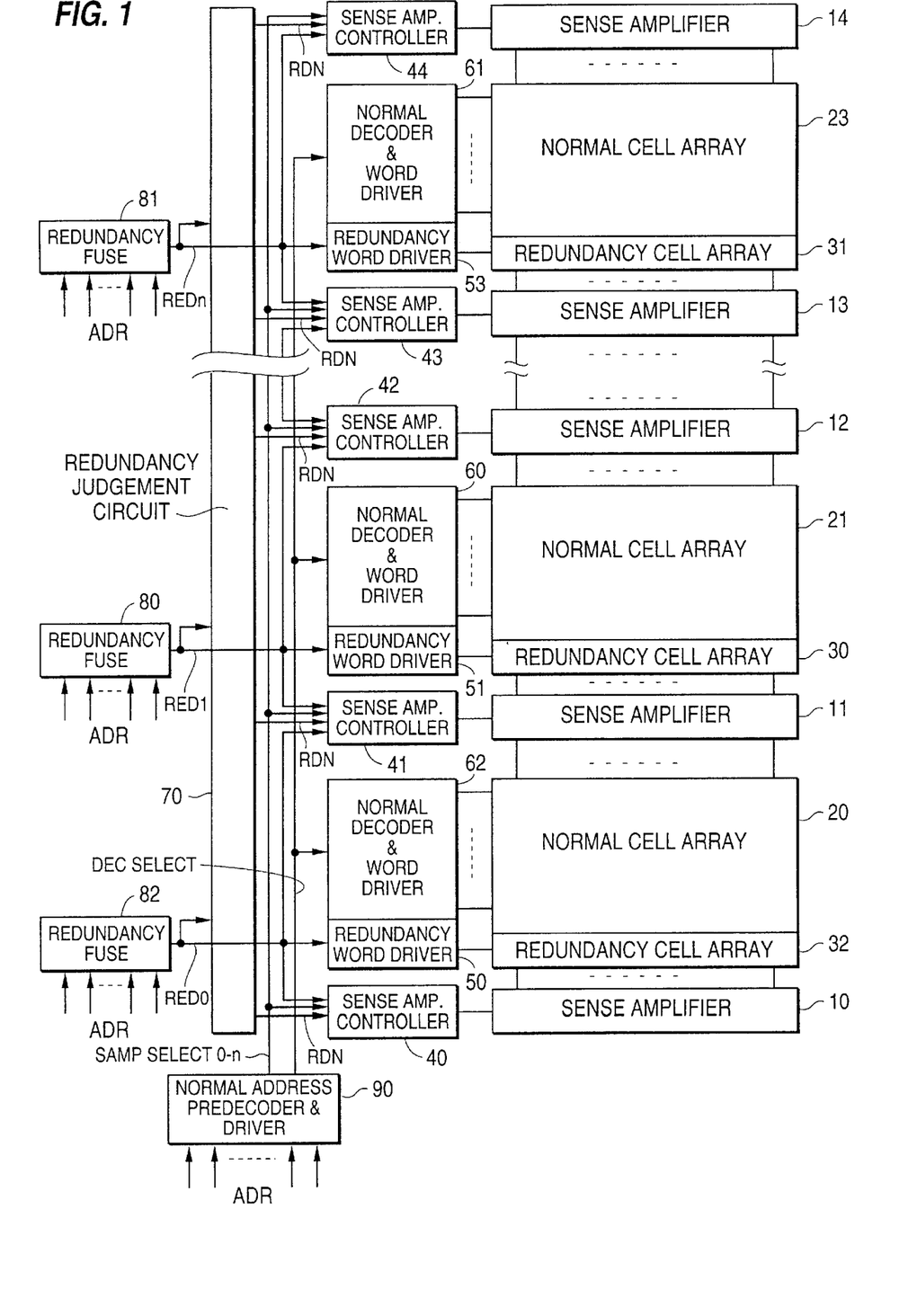
FIG. 1 is a block diagram of a first embodiment according to the present invention.

FIG. 1 is a block diagram illustrative of an embodiment according to the present invention., Redundancy cell arrays 30–32 are provided corresponding to normal cell arrays 20–23, and the respective redundancy cell arrays are placed in the corresponding normal cell arrays in a mixed manner to allow the sense amplifiers for the normal cell arrays to be used also as those for the redundancy cell arrays. Further, redundancy word drivers 50–53 are provided corresponding to the redundancy cell arrays 30–32 respectively. In addition, redundancy fuse circuits 80–82 and a redundancy judgment circuit 70 for detecting a defective address are placed so as to minimize the wiring lengths from the respective redundancy word drivers and the respective amplifier controllers, that is, so as to achieve linear wiring.

In other words, the redundancy word driver, the redundancy fuse circuit and the redundancy cell array are arranged in line. Here, according to the present embodiment, since the cell array, which may replace each normal cell array, matches only one word line.

The operation will now be explained. When an access address ADR is input, a normal address predecoder & driver 90 produces sense amplifier-selecting signals SAMPSELECT 0–n and a decoder-selecting signal DECSELECT likewise as in the prior art. Concurrently, the redundancy fuse circuits 81–82 corresponding to the normal cell arrays detect whether the input access address ADR is a defective address.

Figure 2:
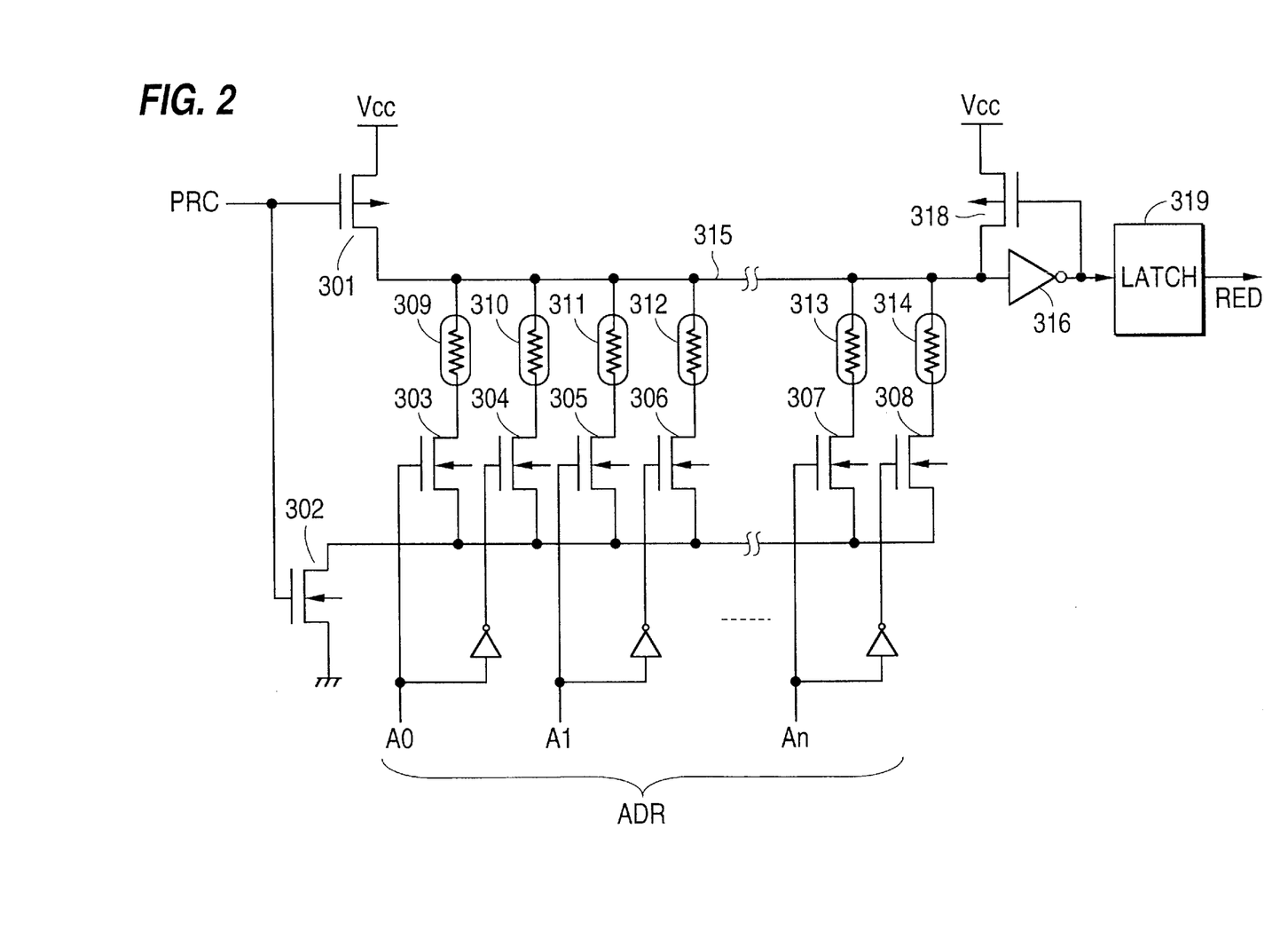
FIG. 2 is a circuit diagram of the redundancy judgment circuit shown in FIG. 1.

FIG. 2 is an illustration of the redundancy fuse circuits. The address signals ADR and their complementary signals (A0–An and their inverted signals) are input to the respective gates of NMOS transistors 303–308, with the respective drains of the respective transistors 303–308 commonly connected to a wired–NOR line 315 via fuses 309–314, respectively. In addition, the sources of the NMOS transistors 303–308 are grounded via a transistor 302. The wired-NOR line 315 is designed to be precharged to a high level by a PMOS transistor 301, and the output from the wired-NOR line 315 is derived as a redundancy fuse output signal RED, or the redundancy control information via an inverter 316 and a latch circuit 319. Here, the PMOS transistor 318 is used to maintain the wired-NOR line 315 at a high level.

At the initial state (when precharged), the precharge signal PRC becomes low, while the transistor 301 is turned on, to precharge the wired-NOR line 315 to a high level. Here, the NMOS transistor 302 is in the off state. When the signal PRC becomes high, the PMOS transistor 301 is turned off. Accordingly, the wired-NOR line 315 is brought to the high-level floating state, and becomes normal state when the NMOR transistor 302 is concurrently turned on.

When the addresses ADR are input in the normal state, the wired-NOR line 315 is brought to a low level by the NMOS transistors 303–308. However, when the associated fuse circuit detects a defective address, the wired-NOR line 315 is kept in the high-level floating state. This is achieved by appropriately selecting and burning the fuses 309–314. Here, the addresses ADR are addresses corresponding to word lines. Although addresses may be decoded by a variety of methods, here, assuming that the addresses A0–An have a one-to-one correspondence with the word lines for simplicity. Then, an explanation will be given regarding the case where the memory cells of the word line which corresponds to the address Al cause a defective address.

The access addresses ADR which correspond to the address A1 are 0, 1 and 0, corresponding to A0, A1 and An, respectively, in the drawing. Here, the fuses 310, 311 and 314 are burnt. As a result, low-level signals are input to the gates of the NMOS transistors 303, 306 and 307, and thus these transistors are brought out of conduction. On the other hand, high-level signals are input to the gates of the NMOS transistors 304, 305 and 308, nevertheless, since the fuses 310, 311 and 314 have been burnt, these transistors are out of conduction as well, thus maintaining the high floating state of the wired-NOR line 315. Here, although the level of the wired-NOR line 315 is inverted by the inverter 316, since the level is again inverted by an inverter (not shown) which is contained in the latch circuit 319, a high-level signal RED is output. As described above, signals RED0–REDn which correspond to the defective address are produced.

Here, the redundancy fuse circuit illustrated in FIG. 2 is a well known example, and the conductive types of the respective transistors are illustrated only by way of example.

Figure 3:
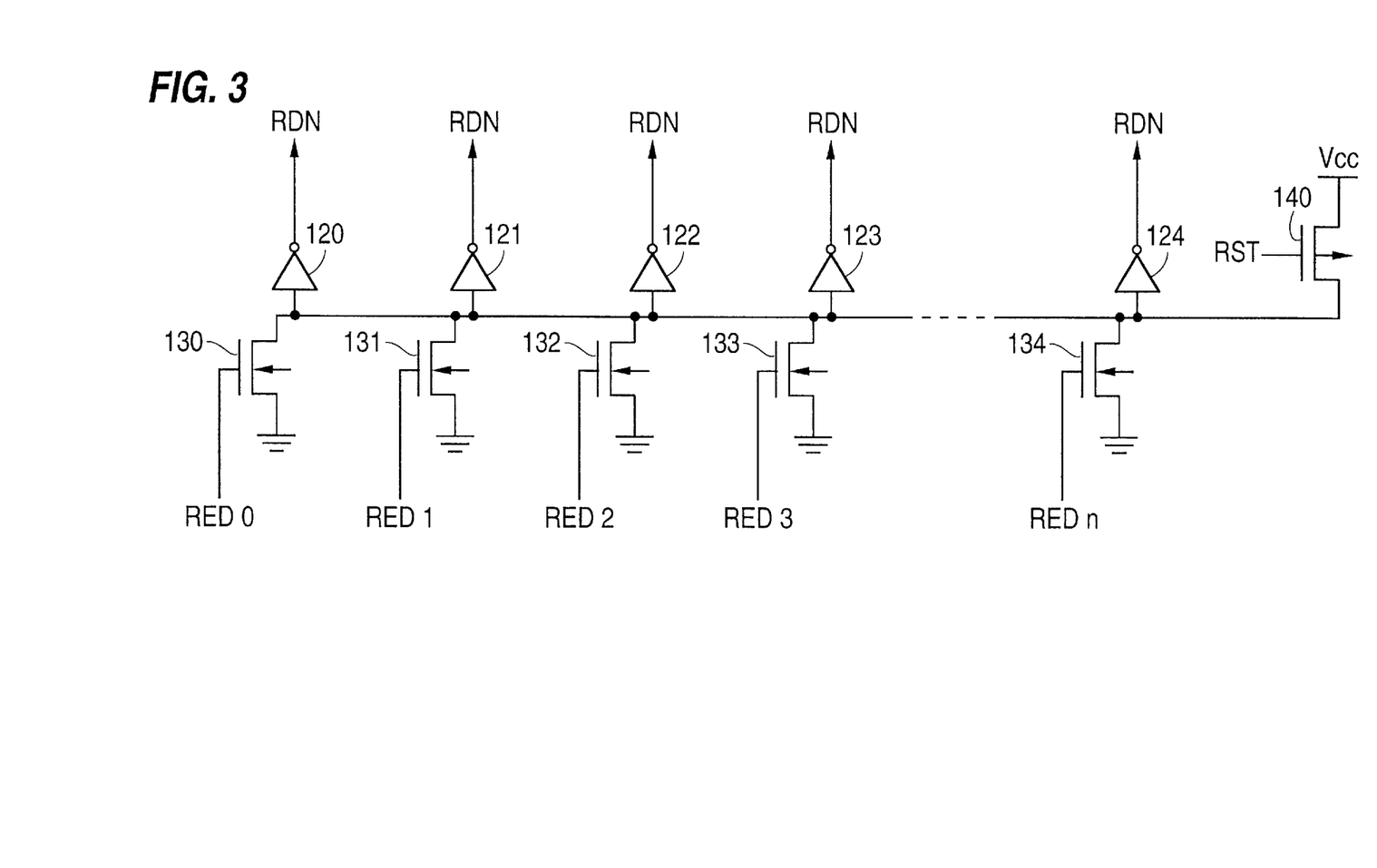
FIG. 3 is a circuit diagram of the sense amplifier controllers shown in FIG. 1.

A redundancy judgment circuit 70 produces a redundancy judgment signal RDN which indicates selection of a defective address when the signals RED0–REDn are input, to control the activation/inactivation of the respective sense amplifier controllers 40–44, FIG. 3 is an illustration of the redundancy judgment circuit 70. In order to guide the output of the wired-NOR line 150 to the respective sense amplifier controllers 40–44, inverters 120–124 are provided corresponding to the sense amplifier controllers. The rest of the configuration is the same as that shown in FIG. 9.

At the initial state, the transistor 140 is on due to a precharge signal RST, while the transistors 130–134 are off, and therefore the wired-NOR line is in a high-level floating state. When activated, the signal RST is first inactivated, and the wired-NOR line is kept in a high-level floating state. When one of the redundancy outputs RED0–REDn becomes high corresponding to the defective address, one of the transistors 130–134 is turned on, the wired-NOR line is rapidly brought to a low level, and all the signals RDN are output at high levels by the inverters 120–124.

The redundancy judgment circuit 70, when operated according to the prior art, outputs a redundancy judgment signal RDN via an output inverter located at an end of the wired-NOR line, whereas when operated according to the present embodiment, signals are amplified (buffered) and output via the inverters 120–124 located near the sense amplifier controllers, since the wired–NOR line and the sense amplifier controllers are placed in parallel in the same direction. This reduces the delays of the signals RED due to wiring, and thus the access time between input of a redundancy signal and judgment for redundancy is shortened as compared with the prior art case.

As an example of the operation with the redundancy fuse circuits 80–82 and the redundancy judgment circuit 70 described above, an explanation will now be given regarding the case where a defective address which corresponds to the redundancy fuse circuit 80 has been input. First the redundancy fuse circuit 80 produces a signal RED1 in response to an access address ADR. The redundancy judgment circuit 70 produces a signal RDN upon receipt of the signal RED1. The signal RDN is input to the sense amplifier controllers 40–44 to suspend the sense amplifier controllers, to suspend the sense amplifiers and the word drivers connected thereto.

Also, the signal RED1 is directly input to a redundancy word driver 51 and the sense amplifier controllers 41 and 42, to operate these sense amplifier controllers.

Figure 4:
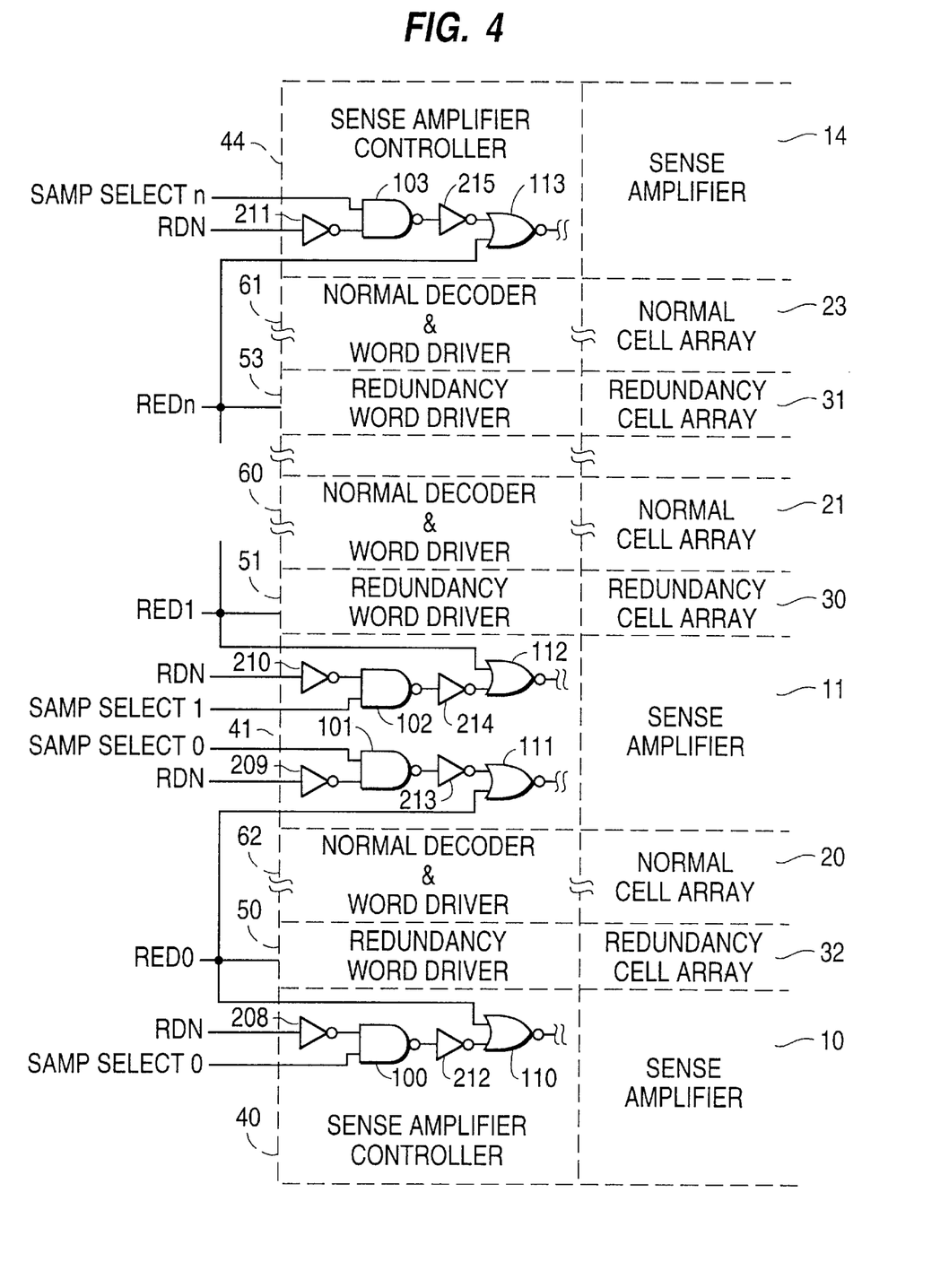
FIG. 4 is a circuit diagram of the redundancy fuse circuits shown in FIG. 1.

FIG. 4 is an illustration of part of the sense amplifier controller circuit. The signals RED 0–n and RDN are at low levels during normal access, a sense amplifier controller selected in response to the signal SAMPSELECT operates. When the signal RED1 is produced as high level, the outputs of NAND gates 100–103 are fixed to high levels due to the high level of the signal RDN. Accordingly, due to the presence of inverters 212–215, either inputs to NOR gates 110–113 are at low levels. Therefore, the outputs of the NOR gates 110–113 become high to inactivate and suspend the sense amplifiers. Since the signal RED1 becomes high, however, the NOR gate 112 to which the signal REDS is input produces a high-level output to activate the sense amplifier 11 for operating the corresponding redundancy cell array 30. Here, it is assumed that the signal RED and the signal RDN are input at almost the same time.

Figure 5:
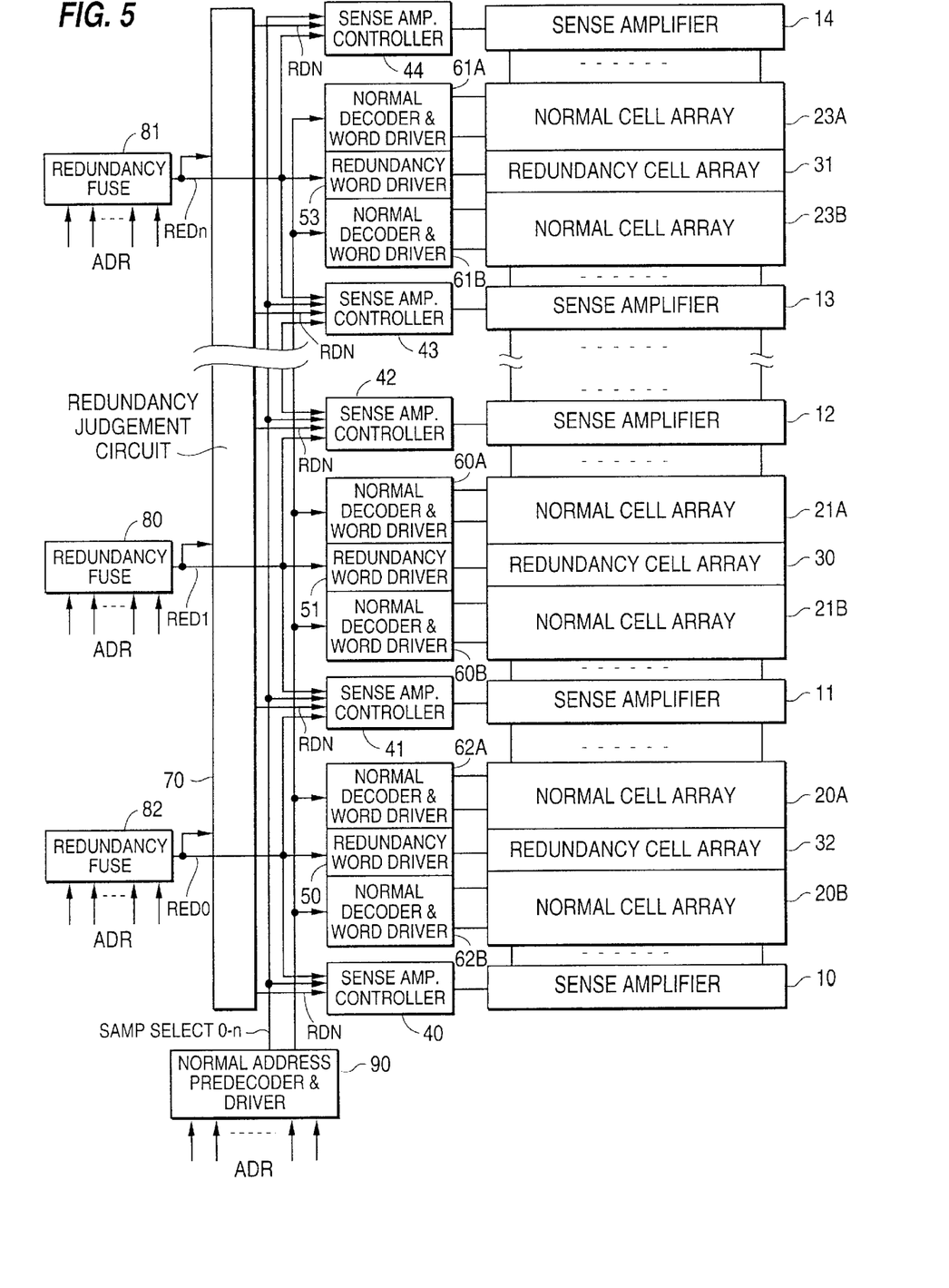
FIG. 5 is a block diagram of a second embodiment according to the present invention.

A second embodiment which is designed to overcome the drawback which the fail of the redundancy cell arrays is shown in FIG. 5, in which like portions are designated by like character references used in FIG. 1. According to the present embodiment, the normal cell array 21 shown in FIG. 1 is divided into two upper and lower portions (21A, 21B) roughly in the center portion, along the direction of the word line, and a redundancy cell array 30 is placed in the center portion. That is, it is designed so that the redundancy ceyl array is prevented from failure by being placed in the center portion of the normal cell array instead of being placed at one end of the normal cell array. This configuration applies to the other normal cell arrays.

Figure 6:
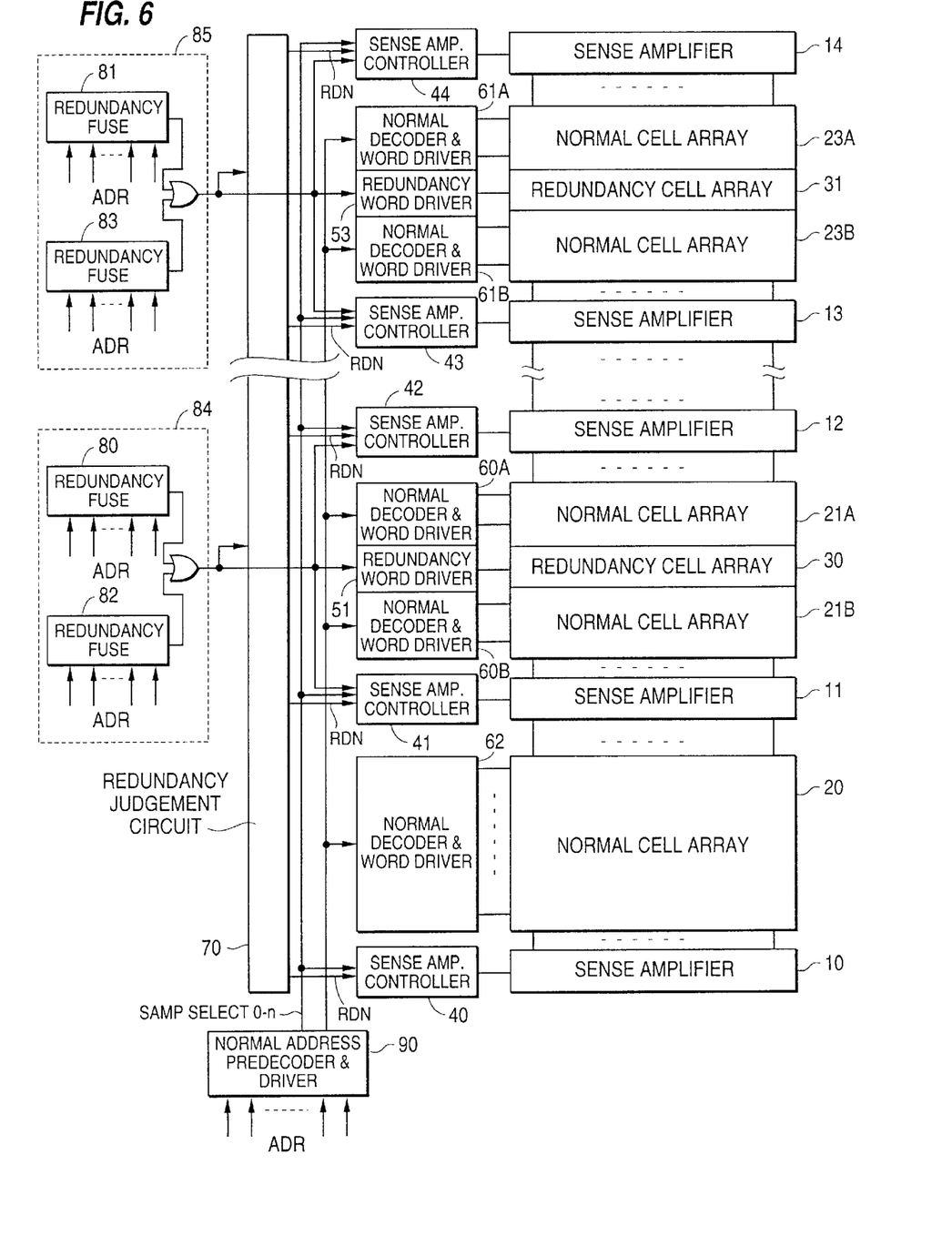
FIG. 6 is a block diagram of a third embodiment according to the present invention.

A third embodiment is shown in FIG. 6, in which like portions are designated by like character references used in FIG. 1. Redundancy cell arrays are provided for all the normal cell arrays with a one-to-one correspondence according to the first and second embodiments shown in FIG. 1 and FIG. 5, whereas redundancy cell arrays are not provided for all the normal cell arrays according to the third embodiment. The reason will now be explained.

Figure 7A:
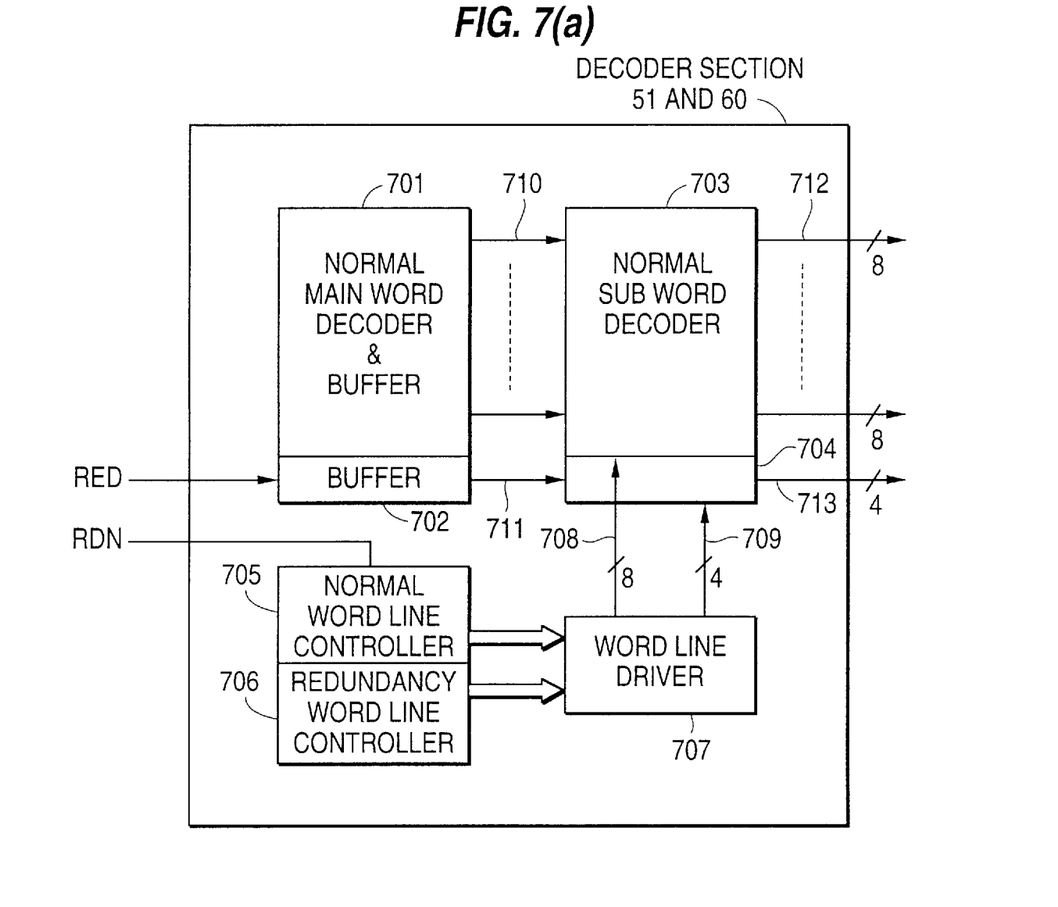
Figure 7B:
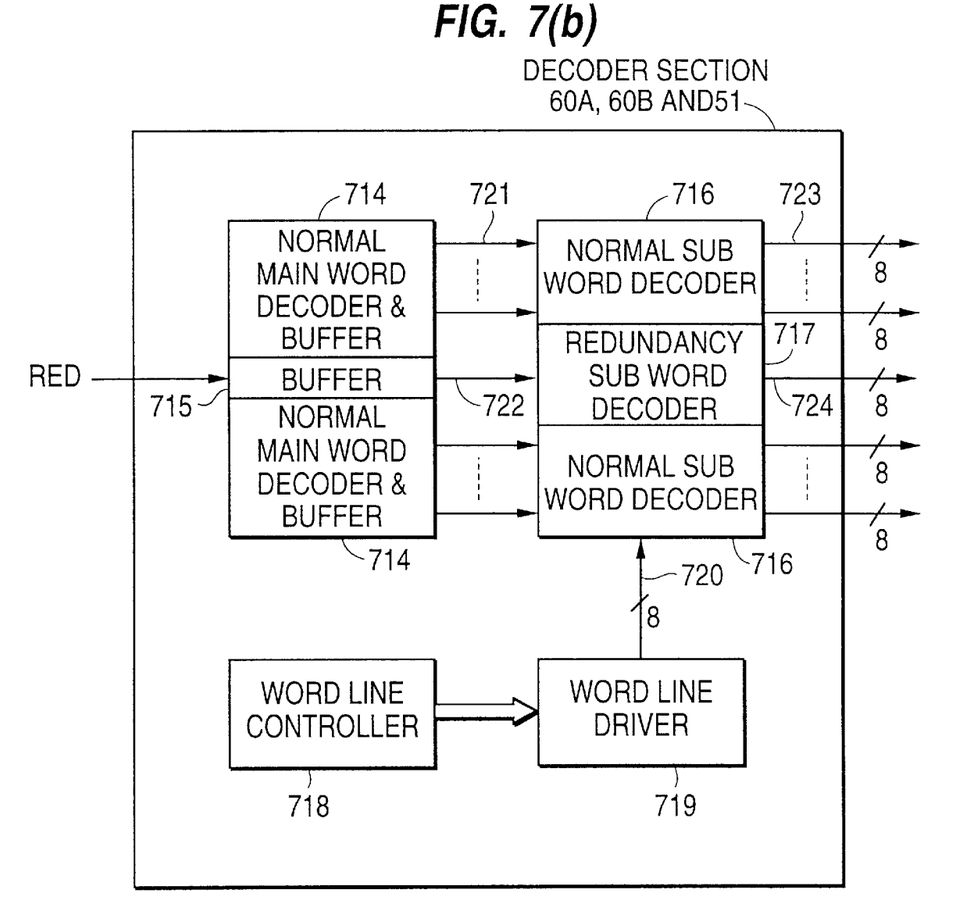

The placement according to the third embodiment is for placement of a minimum number of redundancy cell arrays. Here, it is assumed that the decoder section of the normal decoder & driver 60 is included into a main word decoder and sub word decoder to allow selection of eight sub word lines per one main word line. In other words, a split decoding is used here. In this case, although the eight sub word lines are connected to the one main word line for selection, the minimum number of redundancy cell arrays per normal cell array may be less than eight. Assuming that, the minimum number of redundancy cell arrays corresponds to four word lines, this assumption applies to the first, second and third embodiments. Therefore, according to the first and the second embodiments as shown FIG. 7(a), a normal main word line 710 is replaced by eight redundancy sub word lines 712. Also, a redundancy main word line 711, or the signal RED is replaced by four redundancy sub word lines 713. Therefore, a normal sub word decoder 703 requires eight word driver lines 708, while a redundancy sub word decoder 704 requires four word driver lines 709. Accordingly, it is necessary to provide a redundancy word line controller 706 and a word driver line 709 which are exclusive to the decoder 704 for the sub word line corresponding to the redundancy cell array in the normal and redundancy decoder & drivers. In this connection, normal and redundancy word line controllers are selected by the signal RDN. In contrast, according to the present embodiment as shown FIG. 7(b) and FIG. 6, since redundancy cells in number matching two normal cell arrays are provided in one normal cell array, a redundancy main word line 722 is replaced by eight redundancy sub word Lines 724, which is same replacement number with the normal main word line. Therefore, a redundancy sub word decoder 717 requires eight word driver lines 720 in common to a normal sub word driver 716. Here, a word line controller 718 decodes a sub word address for the sub word decoders which corresponds to an address signals. (as not shown) Accordingly, a word line controller 718 and a word driver line 720 for the normal sub word decoder 716 which corresponds to the normal cell array may be used also for the redundancy decoder 717 which corresponds to the redundancy cells. In other words, the word line controllers may be configured in the same manner by equating the word line replacement number for the normal cell arrays and the word line replacement number for the redundancy cell arrays, and this decreases the chip area. In this embodiment, two of the redundancy fuse circuits are connecting by OR circuit. But the connecting lines are very short. Accordingly, an influence of delay of the redundancy access time is little.

A first effect of the present invention is a reduced access time which is taken for switching to redundancy when a defective address is selected. This results from minimization of the delay due to the wiring, since the redundancy Fuse circuits and the redundancy word drivers are placed with the shortest wiring lengths between them. More specifically, the redundancy fuse circuits disposes to make a line with the redundancy word drivers so as to achieve linear wiring between them. In addition, since the wiring lengths between the respective redundancy fuse circuits and the redundancy word drivers are identical, the additional effect of no difference in the delay times is produced.

A second effect is a decrease in the chip area, since, as described above, the redundancy fuse circuits and the redundancy word drivers are placed with the shortest wiring lengths between them, and also the redundancy judgment circuit is placed in parallel with the two circuits, sandwiched between them, to minimize the increase in the wiring area. More specifically, since usually the wiring widths and the wiring distances required are both on the order of 1 $\mu$m, two wires extend with an approximately 4 $\mu$m width. For example, a 256 Mbit DRAM, which needs 32 redundancy output signals PAD, needs a width on the order of 64 $\mu$m. According to the present invention, since the entire redundancy judgment circuit fits into the width (the maximum size of the gate is estimated to be approximately 10 $\mu$m), the chip area is greatly reduced.

A third effect is a lower probability of failure of the redundancy memory cells. This effect results from the placement of the redundancy memory cell arrays between the normal cell arrays which prevents occurrence of failure due to possible steps between the cell section and the sense amplifier section.

A fourth effect is a reduction in the chip area, since the redundancy memory cell arrays are not provided for all the memory cell array plates, and the word line control circuits may be likewise configured, with the normal word drivers and the redundancy word drivers.

What is claimed is:

1. A semiconductor memory device comprising: a plurality of normal memory cell arrays arranged in a first direction; first and second redundancy memory cell arrays arranged in said first direction such that at least one of said normal memory cell arrays intervenes between said first and second redundancy memory cell arrays, said first redundancy memory cell array including at least one first redundancy word line extending in a second direction perpendicular to said first direction and said second redundancy memory cell array including at least one second redundancy word line extending in said second direction; a first redundancy word driver disposed to make a line with said first redundancy memory cell array in said second direction and coupled to drive said at least one first redundancy word line in response to first redundancy control information; a second redundancy word driver disposed to make a line with said second redundancy memory cell array in said second direction and coupled to drive said at least one second redundancy word line in response to second redundancy control information; a first redundancy control circuit disposed to make a line with said first redundancy word driver in said second direction and producing said first redundancy control information in response to address information; and a second redundancy control circuit disposed to make a line with said second redundancy word driver in said second direction and producing said second redundancy control information in response to said address information.

2. A semiconductor memory device comprising:

a first normal memory cell array including at least one first main word line and a plurality of first sub-word lines;

a second normal memory cell array including at least one second main word line and a plurality of second sub-word lines, said second sub-word lines being equal in number to said first sub-word lines;

a redundancy memory cell array including a plurality of redundancy word lines which are smaller in number than said first sub-word lines, wherein said redundancy memory cell array further includes a plurality of additional redundancy word lines such that a total number of said redundancy word lines and said additional redundancy word lines is equal to the number of said first sub-word lines;

a first normal main word decoder provided to activate said first main word line;

a second normal main word decoder provided to activate said second main word line;

a first normal sub-word circuit supplied with a set of word line drive signals and selecting one of said first sub-word lines when said first main word line is activated;

a second normal sub-word circuit supplied in common with said set of word line drive signals and selecting one of said second sub-word lines when said second main word line is activated; and a redundancy word circuit supplied with a redundancy control signal and in common with said set of word line drive signals and selecting one of said redundancy word lines and said additional redundancy word lines when said redundancy control signal is activated.

3. The semiconductor memory device as claimed in claim 2, wherein said redundancy memory cell array is disposed between said first and second normal memory cell arrays.

4. The semiconductor memory device as claimed in claim 3, wherein said redundancy word circuit is disposed between said first and second normal sub-word circuits.

5. The semiconductor memory device as claimed in claim 4, further comprising a set of signal lines for conveying said set of word line drive signals, said set of signal lines extending to make a line with said first and second normal sub-word circuits and said redundancy word circuit.

* * * * *